United States Patent
Stroupe

[11] Patent Number: 6,069,028
[45] Date of Patent: *May 30, 2000

[54] TECHNIQUE FOR ATTACHING DIE TO LEADS

[75] Inventor: Hugh E. Stroupe, Boise, Id.

[73] Assignee: Micron Technology, Inc., Boise, Id.

[ * ] Notice: This patent is subject to a terminal disclaimer.

[21] Appl. No.: 09/047,025

[22] Filed: Mar. 24, 1998

Related U.S. Application Data

[63] Continuation of application No. 08/581,776, Jan. 2, 1996, Pat. No. 5,807,767.

[51] Int. Cl.$^7$ .................................................. H01L 21/44
[52] U.S. Cl. .......................................... 438/123; 438/121
[58] Field of Search ............................... 438/14, 15, 121, 438/122, 123, 124

[56] References Cited

U.S. PATENT DOCUMENTS

| | | |
|---|---|---|
| 4,652,973 | 3/1987 | Baker et al. . |
| 4,862,245 | 8/1989 | Pashby et al. . |
| 5,076,485 | 12/1991 | MacKay . |
| 5,140,405 | 8/1992 | King et al. . |
| 5,173,369 | 12/1992 | Kataoka . |
| 5,252,853 | 10/1993 | Michii . |
| 5,408,190 | 4/1995 | Wood et al. . |
| 5,440,240 | 8/1995 | Wood et al. . |
| 5,612,259 | 3/1997 | Okutomo et al. . |
| 5,624,268 | 4/1997 | Maeda et al. . |
| 5,749,997 | 5/1998 | Tang et al. . |
| 5,807,767 | 9/1998 | Stroupe ................................ 438/123 |

*Primary Examiner*—Kevin M. Picardat
*Attorney, Agent, or Firm*—Trask, Britt & Rossa

[57] ABSTRACT

A semiconductor die assembly comprising a semiconductor die with bond pads, a plurality of leads which extends across the semiconductor die and terminate over its respective bond pads, and an alpha barrier preferably positioned between the leads and the semiconductor die. Electrical connection is made between the leads and their respective bond pads by a strip of anisotropically conductive elastomeric material, preferably a multi-layer laminate consisting of alternating parallel sheets of a conductive foil and an insulating elastomer wherein the laminate layers are oriented perpendicular to both the bond pad and the lead, positioned between the leads and the bond pads. A burn-in die according to the present invention is also disclosed.

21 Claims, 5 Drawing Sheets

TECHNIQUE FOR ATTACHING DIE TO LEADS

CROSS REFERENCE TO RELATED APPLICATION

This application is a continuation of application Ser. No. 08/581,776, filed Jan. 2, 1996, now U.S. Pat. No. 5,807,767, issued Sep. 15, 1998.

BACKGROUND OF THE INVENTION

1. Field of the Invention

The present invention relates to an improved method for the electrical attachment of a semiconductor die to the leads of a lead frame, and the apparatus formed therefrom. More particularly, the present invention relates to the use of multi-layered or laterally-segmented metal/elastomer strips to achieve electrical contact between the bond pads of a semiconductor die and the leads of a lead frame or other conductor pattern in order to eliminate the necessity for wirebonding or direct lead bonding (TAB) to the semiconductor die.

2. Background Art

The most common die-connection technology in the microelectronics industry is wirebonding. As illustrated in FIG. 6, wirebonding generally starts with a semiconductor die 30 bonded by a die-attach adhesive such as a solder or an epoxy to a lead frame paddle or to a discrete substrate 28. A plurality of bond wires 32 is then placed, one at a time, to electrically connect the bond pads 34 to their corresponding leads 36. One end of each bond wire is attached to a bond pad 34 of the semiconductor die 30, and the other bond wire end is attached to a lead 36.

The bond wires 32 are attached through one of three industry standard wirebonding techniques: ultrasonic bonding—using a combination of pressure and ultrasonic vibration bursts to form a metallurgical cold weld, resulting in a so-called wedge-wedge wire bond; thermocompression bonding—using a combination of pressure and elevated temperature to form a weld, resulting in a so-called ball-wedge wire bond; and thermosonic bonding—using a combination of pressure, elevated temperature, and ultrasonic vibration bursts, resulting in a ball-wedge bond similar to that achieved by thermocompression bonding. Although these wirebonding techniques accomplish the goal of forming electrical contact between the semiconductor die 30 (i.e. through the bond pads 34) and each lead 36, all of these techniques have the drawback of requiring very expensive, high precision, high speed machinery to attach the individual bond wires 32 between the individual bond pads 34 and the leads 36. Moreover, the preferred bond wire material is gold, which becomes extremely expensive for the vast quantities employed in commercial semiconductor fabrication. Other materials employed in the art, such as silver, aluminum/silicon, aluminum/magnesium, and palladium, while less expensive than gold, still contribute significantly to the cost of achieving die/lead frame electrical connections.

U.S. Pat. No. 4,862,245 issued Aug. 29, 1989 to Pashby et al. illustrates an alternate lead arrangement on the semiconductor die (see FIG. 7). The leads 46 are extended over a semiconductor die 40 ("leads over chip" or LOC) toward a central or axial line of bond pads 44 wherein bond wires 42 make the electrical connection between the inner ends of leads 46 and the bond pads 44. Film-type alpha barriers 48 are provided between the semiconductor die 40 and the leads 44, and are adhered to both, thus eliminating the need for a separate die paddle or other die support aside from the leads 46 themselves. The configuration of the '245 patent assists in limiting the ingress of corrosive environmental contaminants to the active surface of the die, achieves a larger portion of the circuit path length encapsulated in the packaging material applied after wire bonding, and reduces electrical resistance caused by the bond wires 42 by placing the lead ends in closer proximity to the bond pads (i.e. the longer the bond wire, the higher the resistance). Although this configuration offers certain advantages, it still requires that bond wires 42 be individually attached between the bond pads 44 and the leads 46.

U.S. Pat. No. 5,252,853 issued Oct. 12, 1993 to Michii illustrates a configuration similar to U.S. Pat. No. 4,862,245 discussed above. However, the lead is further extended to a position over the bond pad wherein the lead is bonded directly to the bond pad (TAB). Although this direct bonding of the lead to the bond pad eliminates the need for wirebonding, it still requires expensive, highly precise equipment to secure the bond between each lead and its corresponding bond pad.

U.S. Pat. No. 5,140,405 issued Aug. 18, 1992 to King et al. addresses the problem of connecting dies to leads by placing a plurality of semiconductor dies in a housing which is clamped to a plate having conductive pads and leads which are precisely aligned with the terminals of the semiconductor dies. A sheet of anisotropically conductive elastomeric material is interposed between the housing and the plate to make electrical contact. The anisotropically conductive elastomeric material is electrically conductive in a direction across its thickness, but non-conductive across its length and width, such as material generally known as an "elastomeric single axis conductive interconnect", or ECPI.

Although the technique of achieving electrical contact between the semiconductor dies and the leads in U.S. Pat. No. 5,140,405 is effective for a plurality of chips, the scheme as taught by the '405 patent is ill-suited for the production of single chips in commercial quantities. The requirement for a housing and the use of a conductive sheet which covers both the housing surface and the semiconductor dies is simply not cost effective when translated to mass production, single-chip conductor attachment or conductor attachment on less than a substantially wafer-scale.

A further industry problem relates to burn-in testing of semiconductor dies. Burn-in is a reliability test of semiconductor dies to identify dies which are demonstrably defective as fabricated, or which would fail prematurely after a short period of proper function. Thus, the die is subjected to an initial heavy duty cycle which elicits latent silicon defects. The typical burn-in process consists of biasing the device against a circuit board or burn-in die, wherein the device is subject to an elevated voltage load while in an oven at temperatures of between about 125–150° C. for approximately 24–48 hours.

A burn-in die generally comprises a sheet of polyimide film laminated to copper foil leads with electrolytically plated metal bumps which extend from the surface of the polyimide film through vias to the copper foil leads. However, the industry standard process for electrolytically plating bumps generally results in different circuit intensities to each copper foil lead on the burn-in die due to the use of individual tie bars as electrical paths between a bus bar and the bump ends of the leads disposed in the plating bath. The differences in circuit intensities caused by the variable cross-sections of the tie bars extending to each copper foil lead result in the plated bumps being non-uniform in diameter and height. The differences in bump diameter and height consequently make uniform contact with the terminals on the semiconductor dies to be tested much more difficult. In general, the connection between the semiconductor die and the burn-in die is non-permanent, wherein the semiconductor die is biased with a spring or the like in the burn-in die such that the bond pads on the semiconductor die contact the plated bumps. Thus, even minor variations between the plated bump heights may result in one or more die terminals failing to make contact with one or more plated bumps. This lack of contact will result in a portion of the semiconductor device not being under a voltage load during the burn-in process. Thus, if a latent silicon defect exists in this portion of the semiconductor device, the burn-in process will not be effective, and the die cannot be effectively electrically tested in the region where the open circuit exists.

U.S. Pat. No. 5,408,190 issued Apr. 18, 1995 to Wood et al. discloses the use of a Z-axis anisotropic conductive sheet of material to electrically connect the bond pads of a die to an intermediate substrate employed in a burn-in assembly for a bare die. However, it appears that a sheet of the anisotropically conductive material is disposed over the entire dies, and, in some instances, the anisotropically conductive sheet is used in combination with wire bonds extending from the intermediate substrate to the carrier.

Therefore, it would be advantageous to develop a technique for efficiently attaching dies to leads which eliminates the wirebonding process step or any other equivalent procedure requiring precise alignment of a lead end and bond pad or other die terminal. Further, it would also be advantageous to develop a technique for quickly and efficiently making non-permanent contact between semiconductor dies and burn-in dies which would alleviate the need for close dimensional control of burn-in die contacts and for continuous, precise biased contact of the die under test (DUT) and the burn-in die.

SUMMARY OF THE INVENTION

The present invention relates to a novel and unobvious technique for electrical attachment (either permanently or non-permanently) of a semiconductor die to the respective leads of a lead frame or other conductor array, and further relates to a semiconductor die assembly and a burn-in die formed using this technique.

The present invention comprises a semiconductor die, preferably with its respective bond pads in a linear arrangement, and a plurality of leads of a lead frame or other conductor array, which leads extend across the semiconductor die and terminate over (above) their corresponding semiconductor die bond pads. The inner ends of the leads may be of any suitable configuration, including pads which are enhanced with downwardly extending flanges. Electrical connection is made between the leads and their respective bond pads by an elongated strip of anisotropically conductive elastomeric material positioned and compressed between the leads and the semiconductor die. As used herein, the term "anisotropically conductive elastomeric material" means and includes a material conductive in a direction transverse to the longitudinal axis or direction of elongation of the strip, but not in the direction of elongation.

The conductive strip is preferably a multi-layer laminate consisting of alternating parallel sheets of a conductive foil and an insulating elastomer, wherein the laminate layers are oriented perpendicular to the planes of both the bond pad and the lead. Thus, the conductive strip is electrically conductive in a direction across its thickness and width (i.e. between the lead and bond pad), but non-conductive across its length (i.e. insulated from electric cross-over between adjacent bond pads or leads). The conductive foil may be any suitable electrically conductive material, such as gold, copper, gold/copper, silver, aluminum, or the like. The insulating elastomer can be any material with insulative properties sufficient to prevent electron flow between the separated, parallel sheets of the conductive foil. The elastomer must be capable of maintaining its resiliency over all anticipated temperature ranges to be encountered by the assembly. A variety of elastomeric compounds as known in the art is suitable.

The number of laminated conductive foils per unit length of the strip, or foil density, must be high enough to form at least one electrically conductive path across each lead/bond pad connection. Preferably, the density of the conductive foils forms two or more conductive paths so as to insure that at least one conductive foil is achieving electrical communication across the lead/bond pad connection.

It is, of course, understood that other available materials having equivalent directional-specific conductive properties can be utilized in place of the conductive strip described, such as material previously referenced and generally known as an "elastomeric single axis conductive interconnect", or ECPI.

In a further aspect of the invention, a dielectric or insulative tape is positioned as an alpha barrier between the leads and the semiconductor die to prevent false electronic gate activations or deactivations due to residual impurities in the encapsulation material employed to package the die after electrical connection of the leads, and to insulate the active or main surface of the die from the leads. The insulative tape is attached to the semiconductor die and to the leads with appropriate adhesive layers as known in the art. Preferably, the insulative tape has properties which are conducive to the semiconductor environment. Thus, the polymeric film preferably has a melting temperature in excess of 175° C. and does not contain ionizable contaminants such as halides and active metals including sodium, potassium and phosphorus. Polyimide films, such as duPont Kapton™, possess the appropriate properties and can be used as an effective alpha barrier insulative tape. The adhesive attachment of the leads to the die through the tape results in precise maintenance of lead position and simultaneous, elastomerically-biased, lead-to-bond pad electrical connection of all leads of a lead frame or other conductor pattern.

A primary advantage of the present invention is the elimination of the necessity for bond wires. The present invention requires no expensive, high precision, high speed machinery to attach the bond wires to the individual bond pads and leads. Furthermore, all electrical connections between the leads and the semiconductor die are simultaneously and adhesively made at ambient temperature upon the contact of the conductive strip with the leads and semiconductor die. This substantially reduces the amount of production time required which, in turn, reduces production costs.

The present invention also has further advantages over both wirebonding or directly bonding the lead to the bond pads. Different thermal coefficients of expansion of the different materials employed in the prior art processes such as TAB result in different rates of thermal expansion and contraction for different elements of the semiconductor die conductive paths when power to the semiconductor die is turned on and off. The differences in thermal coefficients of expansion cause pushing and pulling strains on the components of the semiconductor die. These strains can cause the bond wires or TAB bonds to fatigue and break. However, since the contact between the leads and the bond pads of the present invention is substantially elastic, temperature compensation characteristics of the conductive foil-containing elastomer maintain contact between the leads and the bond pads without fatigue. Furthermore, the elastic qualities of the elastomer allow it to effectively conform to different shaped surfaces, such as the bond pads being either protrusions from the die surface or depressions or recesses in a passivating layer.

The present invention is also advantageous for use in burn-in dies. As previously discussed, the standard burn-in die comprises a sheet of polyimide film laminated to copper foil leads with electrolytically plated metal bumps which extend from the surface of the polyimide film through vias to the copper foil leads. However, the electrolytic bump forming process results in the plated bumps being non-uniform in diameter and height. The differences in bump diameter and height makes uniform contact with the terminals on the DUT's much more difficult.

The present invention solves the contact problem with burn-in dies. When the semiconductor die in a fixture is placed on the burn-in die and biased with a spring or the like, the conductive strip makes non-permanent contact with the bond pads of the semiconductor die. Since the conductive strip is elastic, the DUT makes proper contact with its respective lead. Thus, the use of plated bumps is completely eliminated and, along with it, the problem of non-uniform bump heights. Furthermore, the present invention does not require as high a precision placement of the semiconductor die on the burn-in die. The characteristics of the multi-layer elastomer allow some variation in the orientation of the semiconductor die while still achieving proper electrical contact between the semiconductor die and the burn-in die ends.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
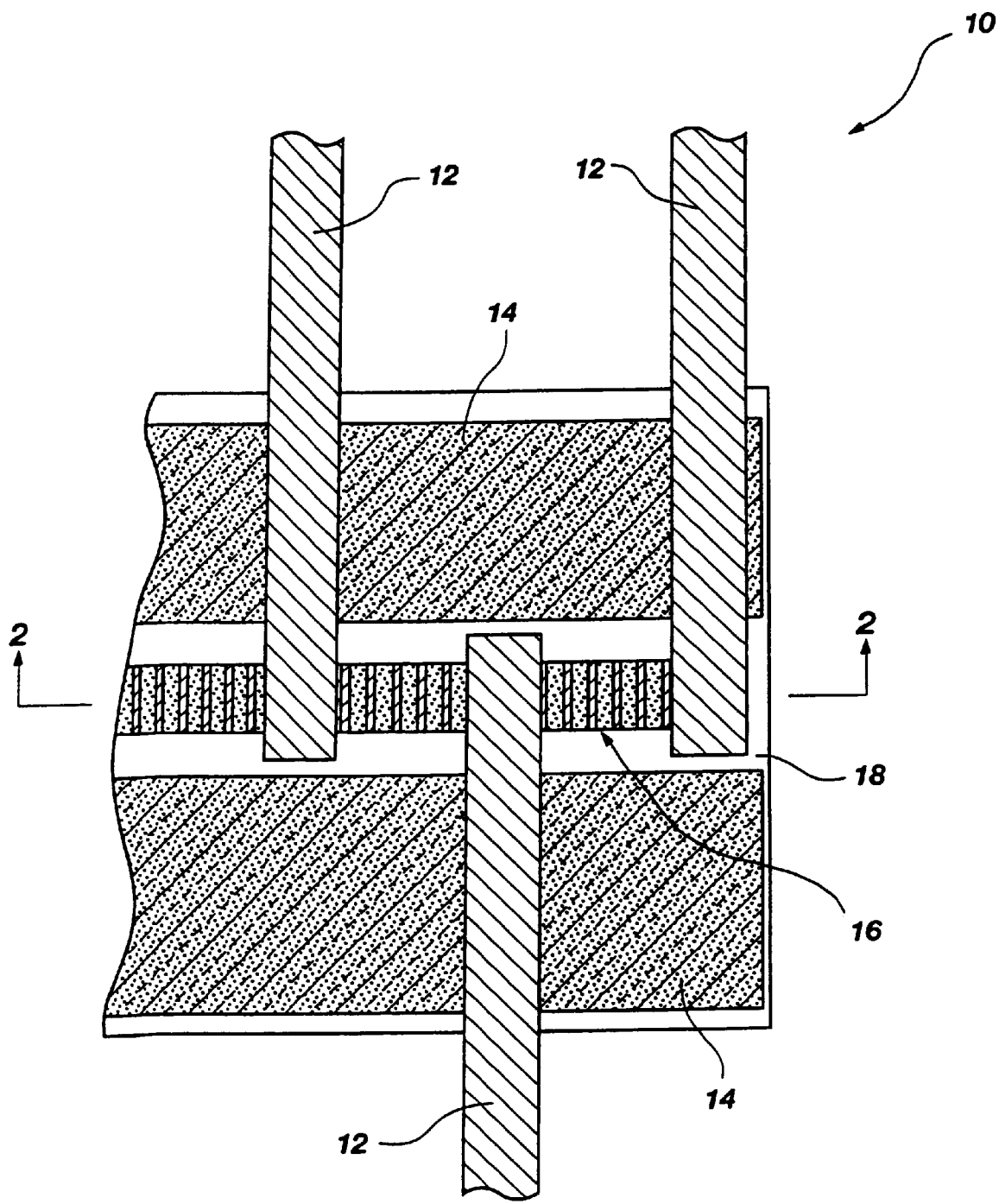
FIG. 1 is a top view of a semiconductor die assembly of the present invention.
Figure 2:
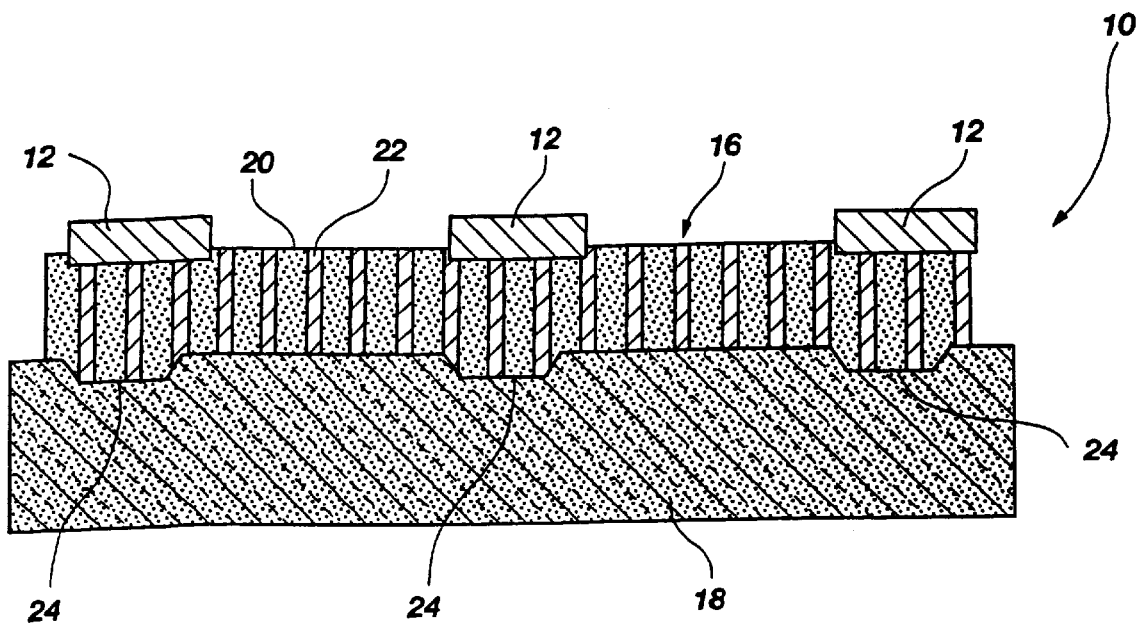
FIG. 2 is a cross-sectional view of the assembly of the present invention along line 2—2 of FIG. 1.
Figure 3:
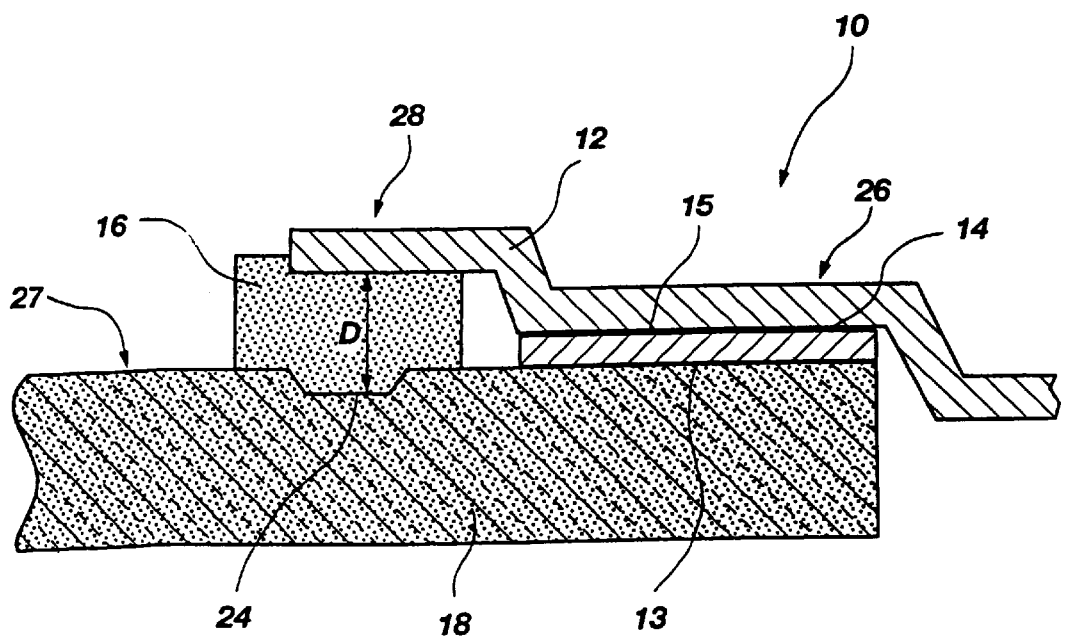
FIG. 3 is a partial plan view of an assembly of the present invention taken from one end of the die assembly.

FIGS. 1–3 illustrate an assembly 10 of the present invention. The assembly 10 comprises a semiconductor die 18 with its respective bond pads 24. One or more leads 12 extend across the semiconductor die 18 and terminate in an appropriate position over their respective bond pads 24.

Interposed between the leads 12 and the semiconductor die 18 is a strip of anisotropically conductive elastomeric material 16. In the illustrated embodiment, the conductive strip 16 is constructed of alternating sheets of a conductive foil 22 and an insulating elastomer 20 comprising a laminate (FIG. 2). Thus, the conductive strip 16 is electrically conductive in a direction across its thickness and width, but non-conductive along its length. The conductive foil 22 may be any suitable electrically conductive material, such as gold, copper, gold/copper, silver, aluminum, alloys of any of the foregoing, or the like. The insulating elastomer 20 can be any material with insulative properties sufficient to prevent substantial electron flow between the separate adjacent sheets of conductive foil 22 (e.g., will not short), and which will maintain its resiliency at all anticipated operating temperatures (including burn-in, if desired) of the assembly. Silicone-based elastomers are particularly suitable for higher temperature environments such as burn-in. Natural elastomers (natural rubber compounds) may be employed but are not preferred. Urethanes may be suitable due to the ease with which the resiliency (durometer) may be adjusted. Such anisotropically conductive elastomeric strip 16 is a commercial product available from several sources. It is, of course, understood that other available materials having equivalent conductive properties can be utilized in place of the conductive strip described, such as the previously-referenced material generally known as an "elastomeric single axis conductive interconnect", or ECPI.

Each conductive foil 22 forms a conductive path through the insulating elastomer 20 to electrically connect the bond pad 24 with the lead 12. The density, spacing or pitch of the conductive foils 22 should be sufficient to present at least one conductive path across each lead 12/bond pad 24 connection. However, preferably the density of the conductive foils 22 present two or more conductive paths across each lead 12/bond pad 24 connection to insure that at least one conductive foil is achieving electrical communication across the lead 12/bond pad 24 connection. Additionally, conductive adhesive as known in the art may be placed on each bond pad 24 to insure a good electrical connection between the conductive foil 22 and the bond pad 24. Therefore, the present invention requires no elevated heat or significant pressure to form the electrical connection between the lead 12 and bond pad 24.

Preferably, an insulative tape 14 is disposed between the leads 12 and the semiconductor die 18 in predetermined areas to act as an alpha barrier to prevent false electronic gate activations or deactivations due to impurities in the plastic encapsulation material applied to the die assembly, or shorting on the active or main surface of the die due to the close proximity of the leads 12 to the semiconductor die 18. The insulative tape 14 is attached to the semiconductor die 18 with an appropriate adhesive 13 known in the art, as well as attached to the leads 12 with an appropriate adhesive 15 known in the art. Preferably, the insulative tape has properties which are conducive to the semiconductor environment. Thus, the polymeric film preferably has a melting temperature in excess of 175° C. and does not contain ionizable contaminants such as halides and active metals including sodium, potassium and phosphorus. Polyimide films, such as duPont Kapton™, possess the appropriate properties and can be used as an effective alpha barrier insulative tape. It is also contemplated that a spray-on or spin-on layer of dielectric may be employed in lieu of a tape or film, but this alternative is less preferred.

FIG. 3 illustrates a further embodiment of the present invention. The lead 12 has a dual plateau arrangement wherein the lead 12 forms a first plateau 26 which is substantially parallel to a top surface 27 of semiconductor die 18. This arrangement allows the first, lower plateau 26 to be adhered to the semiconductor die top surface 27. Preferably, the first plateau 26 is adhered to the insulative tape 14 which is in turn adhered to the semiconductor die top surface 27.

In extending toward the bond pad 24, the lead 12 rises from the first plateau 26 to a second plateau 28. The second plateau 28 is substantially parallel to the bond pad 24 on the semiconductor die 18. As discussed above, the conductive strip 16 is conductively adhered between the lead 12 (i.e. second plateau 28) and the semiconductor die 18 (i.e. bond pad 24). The vertical distance D between the second plateau 28 and the underlying bond pad 24 is designed to conform to the thickness and elasticity of the conductive strip 16 and insure continuous, resilient electrical contact of bond pad 24 and lead 12 under all anticipated operating temperatures while not placing undue stress on the lead frame/die assembly. If the distance D is too small, a torque arm is created which may push the lead 12 upwardly and away from its adhesive connection to semiconductor die 18. If the distance D is too large, the conductive strip 16 may be pulled upon expansion of lead 12 from its adhesive connection between the lead 12 and/or the semiconductor die 18, creating an open circuit.

FIG. 3 also shows the bond pads 24 in recesses. The recessed bond pads 24 can be formed by etching through a shielding layer of passivation material such as a low eutectic glass (as BPSG) or other material known in the art to expose the pad ends of the circuit traces. This eliminates a potential fabrication step of forming bumps or raised areas for the bond pads 24. The resilient nature of conductive strip 16 will conform to the recesses for contact with the bond pads 24.

Figure 4:
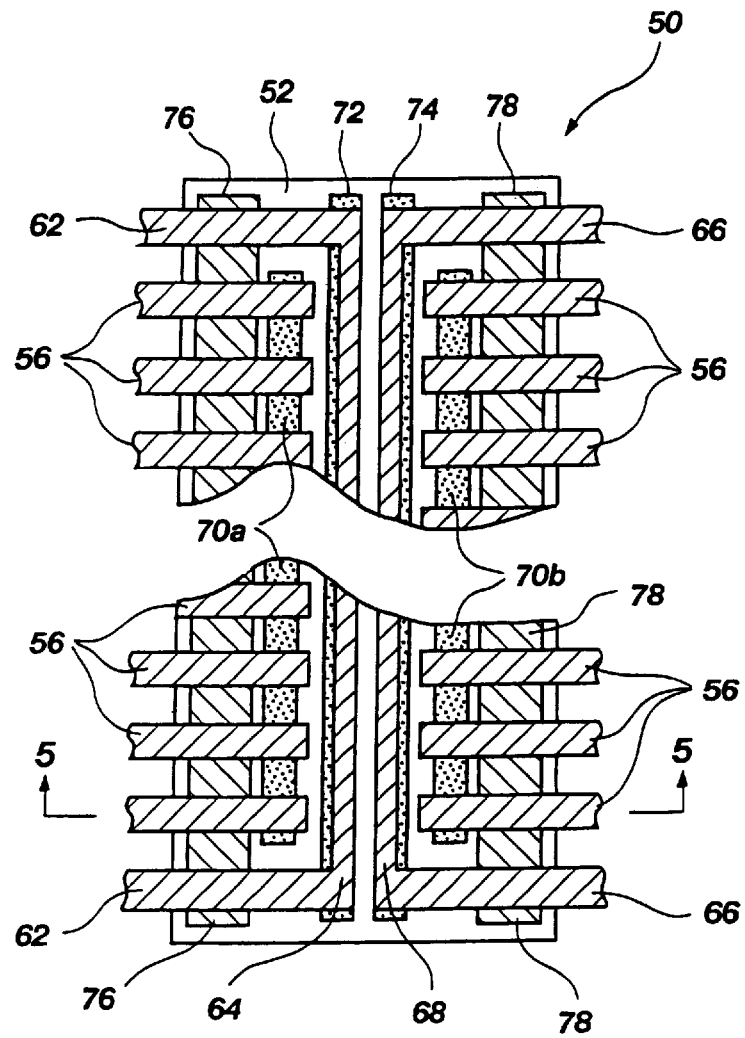
FIG. 4 is a top view of an alternate assembly of the present invention including bus elements on the lead frame.
Figure 5:
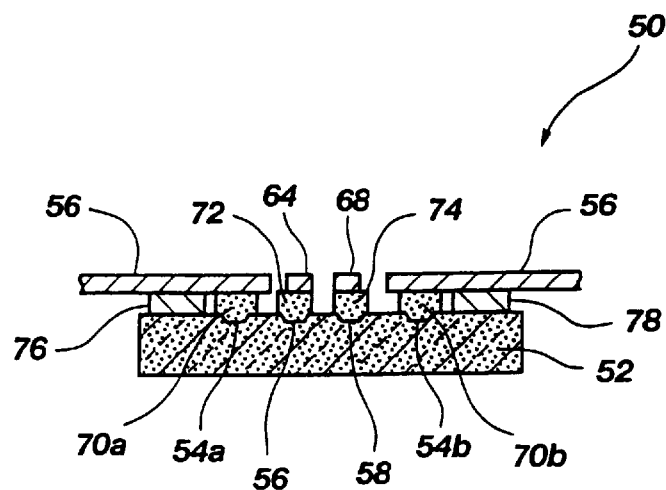
FIG. 5 is a cross-sectional view of the alternate assembly of the present invention along line 5—5 of FIG. 4.
Figure 6:
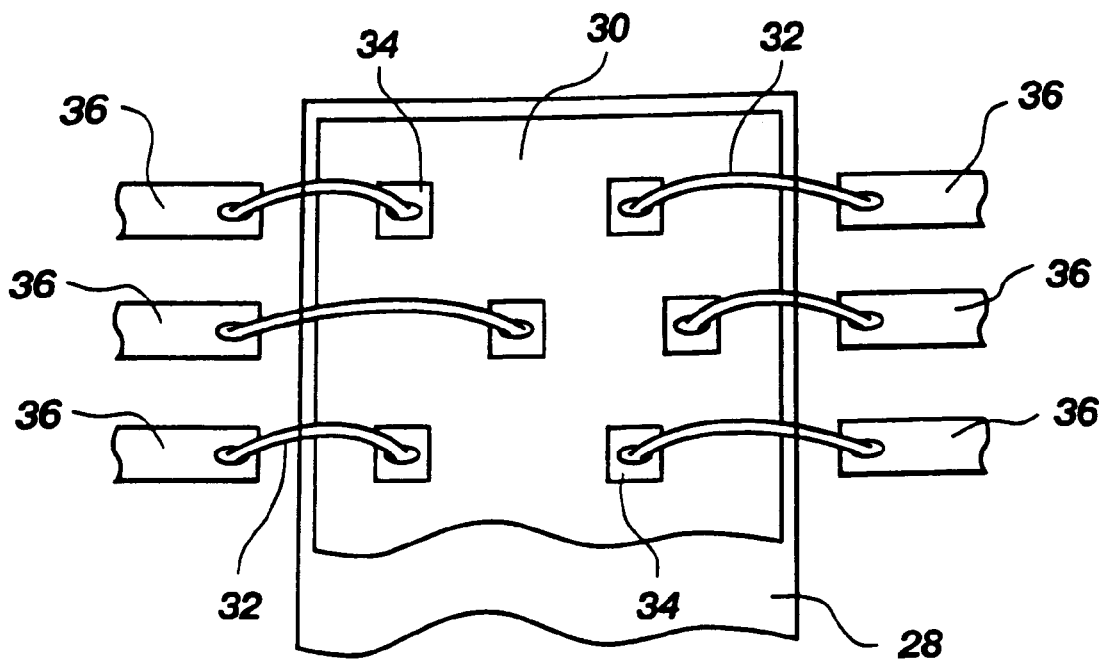
FIG. 6 is a top view of a prior art semiconductor die assembly using bond wires to connect the leads to the bond pads prior to encapsulation of the semiconductor die in a protective coating.
Figure 7:
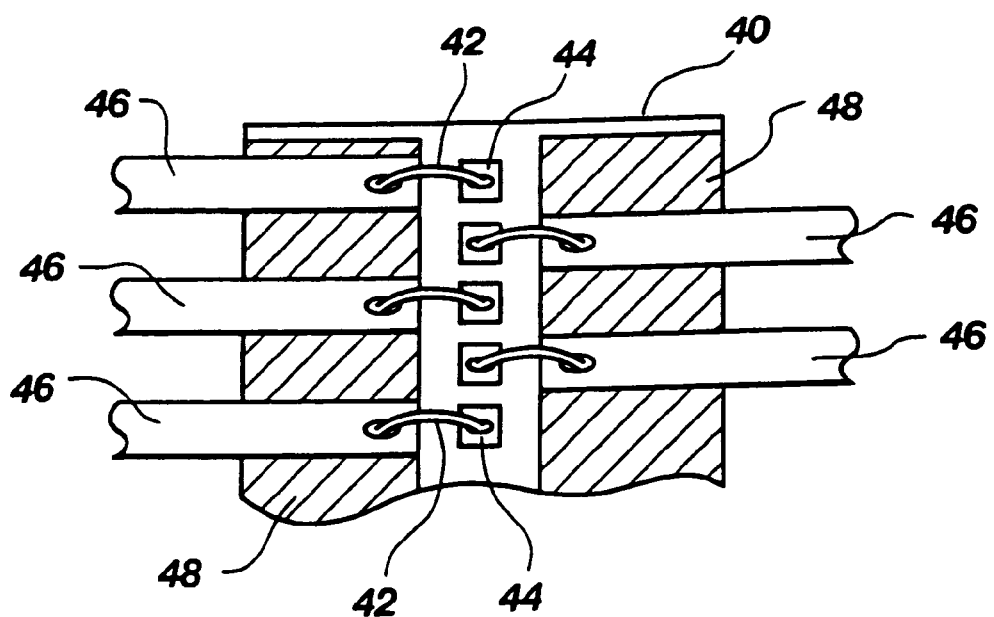
FIG. 7 is a top view of a prior art semiconductor die assembly using leads extending onto the semiconductor die using bond wires to connect the leads to the bond pads prior to encapsulation of the semiconductor die in a protective coating.

FIGS. 4 and 5 illustrate a top view and a cross-sectional view, respectively, of another embodiment of the present invention. An assembly 50 comprises a semiconductor die 52 with rows of bond pads 54a, 54b, 56, and 58. A plurality of leads 56 extends across the semiconductor die 52 and terminates in an appropriate position over its respective bond pads 54a and 54b. The assembly 50 also includes a shared power lead 62 having a bus portion 64 which extends along the row of bond pads 56. The assembly 50 further includes a shared ground lead 66, formed in substantially the same shape as the shared power lead 62, having a bus portion 68 which extends along the row of bond pads 58.

Interposed between the leads 56 and each row of bond pads 54a and 54b is a strip of anisotropically conductive elastomeric material 70a and 70b. Additionally, the assembly 50 includes a strip of anisotropically conductive elastomeric material 72 interposed between power lead bus 64 and bond pads 56, and a strip of anisotropically conductive elastomeric material 74 interposed between ground lead bus 68 and bond pads 58.

Preferably, insulative tapes 76 and 78 are adhesively attached over the semiconductor die 52 and under the leads 56. The insulative tape 76 is also attached to the semiconductor die 52 and the power lead 62, and the insulative tape 78 is also attached to the semiconductor die 52 and the ground lead 66.

It should be noted that the leads/strip/die assembly may be conformally coated with an insulative coating subsequent to assembly to enhance the mutual electrical isolation of the connections made, and to protect the assembly and the leads from displacement during a subsequent transfer molding process, wherein the assembly is packaged in plastic.

It is also possible to locate the leads over the die and conductive strips without the use of an interposed insulative tape, and to apply a conformal insulative coating to and between the leads/strip/die assembly to adhere the leads to the die.

Figure 8:
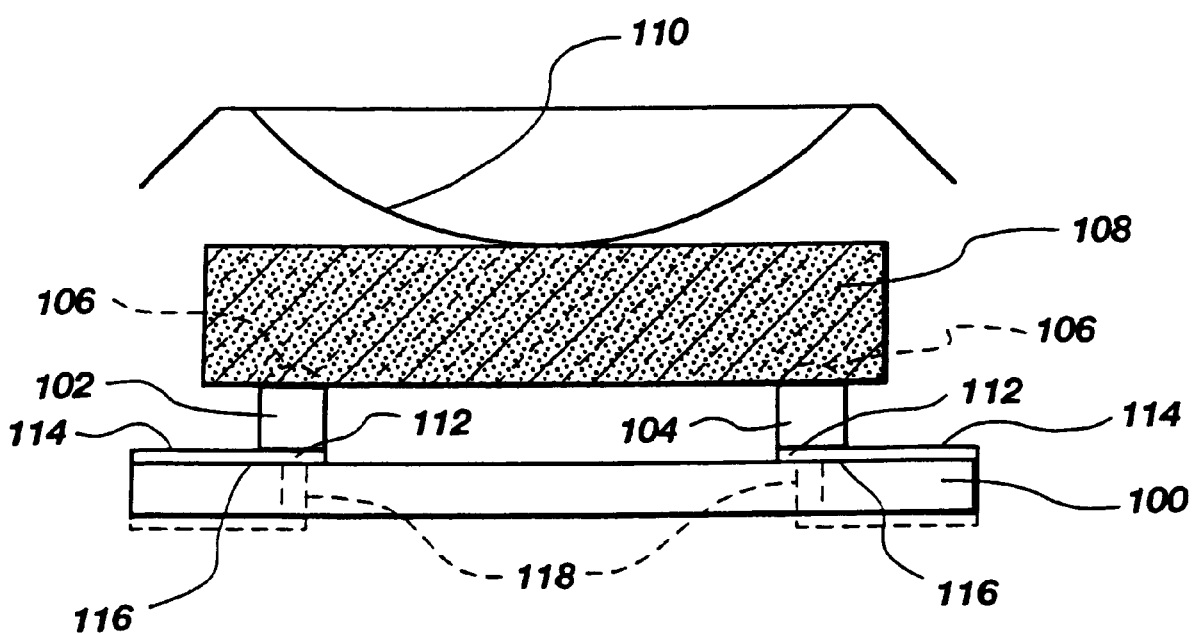
FIG. 8 is a schematic side elevation of a burn-in die according to the present invention with a DUT in place for testing.

FIG. 8 schematically illustrates the use of anisotropically conductive elastomeric material strips 102 and 104 on the upper surface of a burn-in die or substrate 100 with the bond pads 106 of a "flipped" semiconductor die 108 pressed against the strips 102 and 104 by a biasing element such as leaf spring 110. Strips 102 and 104 are adhered to the face of the burn-in die with a conductive adhesive 112 to prevent separation therefrom after burn-in when die 108 is removed. Circuit traces 114 extend from the periphery of burn-in die substrate 100 to trace ends 116 under strips 102 and 104. Circuit traces 114 may reside on the upper surface of the substrate 100 as shown, extend through vias 118 (broken lines) to the opposite side and then to the substrate periphery, or be formed within the substrate 100, as where substrate 100 is a film/trace/film laminate as known in the art.

Although the illustrated embodiment shows the connection of leads or a burn-in die to a semiconductor die, it is, of course, understood that the present invention can adapted to a multitude of other arrangements for securing an electrical connection between the bond pads or other terminals of a semiconductor die and any type of conductor array used therewith.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method of connecting a semiconductor die to a lead of a lead frame comprising the steps of:

providing said semiconductor die having at least one bond pad on a surface of said semiconductor die;

disposing a plurality of leads of said lead frame over said semiconductor die wherein at least one of said leads extends over the at least one bond pad; and compressing an elongated strip of anisotropically conductive elastomeric material between said at least one bond pad and at least one lead of said plurality of leads.

2. The method of claim 1, wherein the strip of anisotropically conductive elastomeric material is adhesively, conductively bonded to said at least one bond pad.

3. The method of claim 1, wherein the strip of anisotropically conductive elastomeric material is non-conductive in a direction of its elongation.

4. The method of claim 3, wherein the strip of anisotropically conductive elastomeric material comprises a laminate of alternating, substantially parallel sheets of a conductive foil and segments of an insulating elastomer.

5. The method of claim 4, wherein the conductive foil is a metal.

6. The method of claim 5, wherein the metal is selected from the group comprising:

copper, gold, silver, aluminum and alloys thereof.

7. The method of claim 4, wherein the insulating elastomer prevents substantial electrical contact between adjacent sheets of conductive foil.

8. The method of claim 7, wherein the insulating elastomer is selected from the group comprising synthetic elastomers and natural elastomers.

9. The method of claim 1, further comprising the step of adhering an insulative tape between the plurality of leads and said surface of said semiconductor die.

10. The method of claim 1, wherein said plurality of leads each have a first plateau and a second plateau, wherein the first plateau is positioned over and is attached to said surface of said semiconductor die, and wherein said second plateau is positioned over said at least one bond pads and said strip of anisotropically conductive elastomeric material is secured between said second plateau and said at least one bond pad.

11. The method of claim 1, further comprising the steps of:

providing a shared power lead with a bus and a set of power lead bond pads on said semiconductor die arranged in a row on said surface of said semiconductor die, wherein the bus is disposed above the power lead bond pads with a strip of anisotropically conductive elastomeric material secured between said power lead bond pads and said power lead bus; and providing a shared ground lead with a bus and a set of ground lead bond pads on said semiconductor die arranged in a row on said main surface, wherein the bus is disposed above the ground lead bond pads with a strip of anisotropically conductive elastomeric material secured between said ground lead bond pads and said ground lead bus.

12. The method of claim 1, wherein the strip of anisotropically conductive elastomer material is conductive in a direction substantially lateral to the elongation of the strip.

13. A method of attaching a semiconductor die for the burn-in testing thereof, comprising the steps of:

providing at least one circuit trace mounted to a substrate and terminating in at least one pattern of at least one trace end on a surface of said at least one substrate;

configuring said trace end pattern to correspond to a pattern of at least one bond pad on a semiconductor die to be tested; and disposing an elongated strip of anisotropically conductive elastomeric material over said at least one trace end on said substrate surface.

14. The method of claim 13, wherein the strip of anisotropically conductive elastomeric material is adhesively, conductively bonded to said trace ends.

15. The method of claim 13, wherein the strip of anisotropically conductive elastomeric material is non-conductive in a direction of its elongation.

16. The method of claim 15, wherein the strip of anisotropically conductive elastomeric material comprises alternating laminated sheets of conductive foil and insulating elastomer.

17. The method of claim 16, wherein the conductive foil is a metal.

18. The method of claim 17, wherein the metal is selected from the group comprising:

copper, gold, silver, aluminum and alloys thereof.

19. The method of claim 16, wherein the insulating elastomer prevents substantial electrical connection between adjacent sheets of conductive foil.

20. The method of claim 19, wherein the insulating elastomer is selected from the group comprising synthetic elastomers and natural elastomers.

21. The method of claim 13, wherein the strip of anisotropically conductive elastomer material is conductive in a direction substantially lateral to the elongation of the strip.

* * * * *

UNITED STATES PATENT AND TRADEMARK OFFICE
CERTIFICATE OF CORRECTION

PATENT NO. : 6,069,028
DATED : May 30, 2000
INVENTOR(S) : Stroupe

It is certified that error appears in the above-identified patent and that said Letters Patent is hereby corrected as shown below:

<u>Title page, Abstract,</u>
Line 3, change "terminate" to -- terminates --.

<u>Drawings,</u>
Figure 5, change reference numeral "56" referring to "bond pad" at bottom of figure to -- 58a -- ( as "56" refers to "leads") and change reference numeral "58" to -- 58b --.

<u>Column 1,</u>
Line 15, delete "," after "frame";
Line 47, after "(i.e." insert -- , --;
Line 63, change "("leads over chip"" to -- ("leads-over-chip" --;

<u>Column 2,</u>
Line 1, change "44," to -- 46, --;
Line 9, after "(i.e." insert -- , --;

<u>Column 3,</u>
Line 24, change "dies," to -- die, --;

<u>Column 4,</u>
Line 1, after "(i.e." insert -- , --;
Line 3, after "(i.e." insert -- , --;

<u>Column 5,</u>
Line 21, change "makes" to -- make --;

<u>Column 7,</u>
Line 20, change after "(i.e." insert -- , --;
Line 21, change after "(i.e." insert -- , --;
Line 46, change "56, and 58." to -- 58a and 58b. --;
Line 51, change "56." to -- 58a. --;
Line 54, change "58." to -- 58b. --;
Line 60, change "56," to -- 58a, --;
Line 62, change "58," to -- 58b. --;

<u>Column 8,</u>
Line 35, after "can" insert -- be --.

<u>Column 8, claim 1,</u>
Line 53, after "said" insert -- plurality of --;

UNITED STATES PATENT AND TRADEMARK OFFICE
CERTIFICATE OF CORRECTION

PATENT NO. : 6,069,028
DATED : May 30, 2000
INVENTOR(S) : Stroupe

It is certified that error appears in the above-identified patent and that said Letters Patent is hereby corrected as shown below:

Column 9,
Claim 7, line 8, after "of" insert -- said --;
Claim 10, line 19, change "pads" to -- pad -- and after "said" and before "strip" insert -- elongated --;
Claim 12, line 38, after "the" (second occurrence) and before "strip" insert -- elongated --;

Column 10,
Claim 13, line 5, after "said" delete "at least one";
Claim 13, line 6, after "said" and before "trace" insert -- at least one --;
Claim 14, line 14, after "said" insert -- at least one --;
Claim 15, line 15, after "the" (second occurrence) and before "strip" insert -- elongated --;
Claim 16, line 18, after "the" (second occurrence) and before "strip" insert -- elongated --;
Claim 19, line 29, after "of" insert -- said --; and
Claim 21, line 33, after "the" (second occurrence) and before "strip" insert -- elongated --.

Signed and Sealed this

Thirteenth Day of November, 2001

Attest:

*Attesting Officer*

NICHOLAS P. GODICI
*Acting Director of the United States Patent and Trademark Office*